United States Patent [19]
Bergemont et al.

[11] Patent Number: 4,877,483
[45] Date of Patent: Oct. 31, 1989

[54] METHOD FOR CONTACT BETWEEN TWO CONDUCTIVE OR SEMI-CONDUCTIVE LAYERS DEPOSITED ON A SUBSTRATE

[75] Inventors: Albert Bergemont, La Tronche; Richard Ferrant, Aix En Provence, both of France

[73] Assignee: S.G.S. Thomson Microelectronics, S.A., Gentilly, France

[21] Appl. No.: 212,889

[22] Filed: Jun. 29, 1988

[30] Foreign Application Priority Data

Jul. 3, 1987 [FR] France .................. 87 09455

[51] Int. Cl.⁴ .................. H01L 21/306; B44C 1/22; C03C 15/00; C23F 1/02
[52] U.S. Cl. .................. 156/653; 156/656; 156/657; 156/659.1; 156/662; 357/71; 437/191; 437/195; 437/228; 437/233
[58] Field of Search .......... 156/653, 656, 657, 659.1, 156/662; 437/189, 191–193, 195, 228, 233; 357/71; 365/200

[56] References Cited

U.S. PATENT DOCUMENTS

| | | | |
|---|---|---|---|
| 4,397,887 | 8/1983 | Aytac et al. | 156/653 X |
| 4,423,547 | 1/1984 | Farrar et al. | 156/653 X |
| 4,518,629 | 5/1985 | Jeuch | 156/653 X |

FOREIGN PATENT DOCUMENTS 0201250 11/1986 European Pat. Off. .

OTHER PUBLICATIONS

Self-Aligned Transistor with Sidewall Base Electrode, Kakamura et al., IEEE Transactions on Electron Devices, vol. ED-29, No. 4, Apr. 1982, pp. 596–600.

Primary Examiner—William A. Powell
Attorney, Agent, or Firm—Roland Plottel

[57] ABSTRACT

A method of contact between two conductive or semi-conductive layers deposited on a substrate is disclosed. The method comprises the following steps:
the depositing and etching of a first layer,
the depositing of an insulating layer under pressure and temperature conditions such that the insulating layer is thinned at the edges of the etched zones of the first layer as compared with the thickness on the surface of the substrate and on the surfaces of the etched zones of the first layer,
the chemical etching of the insulating layer on a thickness at least equal to the thickness of the thinned layer but substantially smaller than the thickness elsewhere,
the depositing and etching of the second conductive or semiconductive layer under pressure and temperature conditions leading to high covering capacity.

13 Claims, 3 Drawing Sheets

METHOD FOR CONTACT BETWEEN TWO CONDUCTIVE OR SEMI-CONDUCTIVE LAYERS DEPOSITED ON A SUBSTRATE

BACKGROUND OF THE INVENTION

1. Field of the Invention

The invention pertains to a method for contact between two conductive or semi-conductive layers deposited on a substrate. This method is used chiefly in the manufacture of integrated circuits.

2. Description of the Prior Art

In the prior art, electrical uninterrupted connection is set up by deposited strips of polycrystalline silicon or metal which connect the doped zones according to the desired electrical diagram. More particularly, electrical uninterrupted connection is provided by depositing a layer of insulating material on the appropriately doped substrate or on a first layer of strips made of conductive or semi-conductive material, by opening windows in this layer of insulating material and then etching a second layer of strips made of conductive or semi-conductive material. The windows are opened by using standard photolithographic processes. With these processes, the contacts between the layers is set up physically on their surface so that for a low current density, a major surface is reserved for the contact.

The present invention is based on a different idea providing for more intensive integration and for making maximum use of the geometrical possibilities offered by the principles that govern the designing of an integrated circuit.

SUMMARY OF THE INVENTION

Consequently, an object of the present invention is a method of contact between two conductive or semi-conductive layers deposited on a substrate, comprising the following steps:

the depositing and etching of a first layer, the depositing of an insulating layer under pressure and temperature conditions such that the insulating layer is thinned at the edges of the etched zones of the first layer as compared with the thickness on the surface of the substrate and on the surfaces of the etched zones of the first layer, the chemical etching of the insulating layer on a thickness, at least equal to the thickness of the thinned layer but substantially smaller than the thickness elsewhere, the depositing and etching of the second conductive or semi-conductive layer under pressure and temperature conditions leading to high covering capacity.

According to a preferred embodiment, the insulating layer consists of silicon oxide containing 8 to 9% of phosphorus. This deposit is done by vapour phase deposition at low temperature and low pressure.

This method has several advantages. It is far simpler than the commonly used photolithographic processes because masks are no longer used. Moreover, there is a self-alignment of the contacts which can be made in small dimensions.

Another advantage of the invention is that it enables the programming of a junction without the need to use any mask. This feature is extremely worthwhile because it reduces the number of integrating operations. More particularly, the invention can be applied to the manufacture of permanently-recorded memories known as Read Only Memories or ROMS.

BRIEF DESCRIPTION OF THE DRAWINGS

Other advantages and features of the present invention will be better understood from the following description made with reference to the appended drawings, of which.

DESCRIPTION OF PREFERRED EMBODIMENTS

Figure 1:
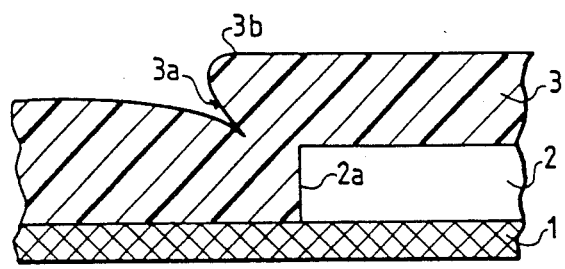
FIGS. 1 to 3 are sectional views showing three steps of the method according to the invention.
Figure 2:
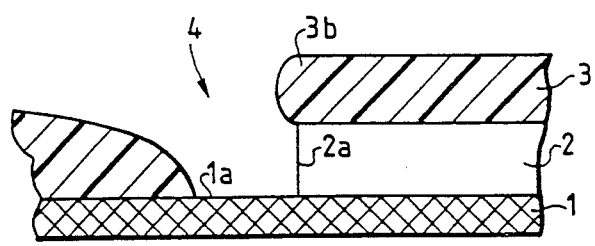
Figure 3:
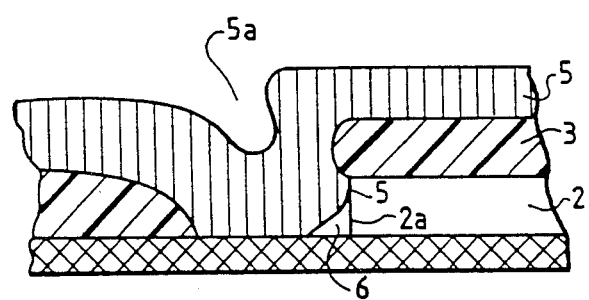

FIGS. 1 to 3 show a method for making contacts between two semiconductive layers. FIG. 1 shows the first manufacturing step. An insulating layer 1 made of silicon oxide, for example, is used as a substrate. A layer of polycrystalline silicon is deposited and then etched so as to give a geometrical thickness shape 2, on the substrate 1. This shape has at least one substantially vertical edge 2a designed to provide a contact surface for a subsequent connection. Then a layer of transfer material is deposited in vapor phase at low temperature: this is a layer of insulating material which is used mainly to cause the silicon of a a second layer to grow while it is deposited on the contact edge 2a. In the preferred embodiment, this layer is a phosphorus-doped silicon oxide deposited in vapor phase at low temperature and low pressure. Preferably, the silicon oxide contains 8 to 9% of phosphorus. The depositing is done at a temperature ranging between 400° C. and 450° C.

In these depositing conditions, the transfer layer is shaped so as to create a groove 3a on the edge 3b of the layer, which is close to the strip 2. This groove 3a will be used in the next step illustrated in FIG. 2.

In this second step, the transfer layer 3 is etched chemically. The geometry of the groove 3a as well as the strains in the layer enable etching preferably around the axis of the groove. Thus the substrate 1 is separated from the oxide of the transfer layer 3 as well as the edge 2a of the silicon 2.

FIG. 3 shows the making of a contact on the edge 2a. A layer of polycrystalline silicon is deposited under suitable pressure and temperature conditions. From the top of the edge 2a a contact zone 5 is set up. A groove 5a can be seen on the free surface of the layer 5. This groove corresponds to an empty pocket 6 bounded by the layer 5, the substrate 1 and the layer 2. This pocket 6 is all the smaller as the second layer 5 has high covering capacity. It is thus possible to check the geometrical characteristics of the contact between the two silicon layers. This feature of the invention is used, for each element, for the programming of the P-N junction, with each layer 2 or 5 receiving a P or N doping.

Figure 4:
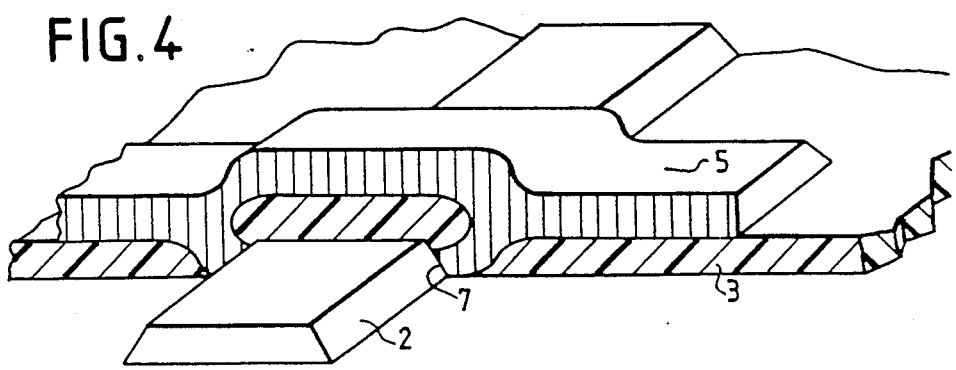
FIG. 4 is a perspective view of an embodiment of a circuit according to the invention.

FIG. 4 shows a perspective view in a partial section of a portion of integrated circuit where the elements already described in FIGS. 1-3 have the same reference numbers. The layer 2 of polycrystalline silicon has been etched in the shape of a strip and has a P-type doping. The silicon oxide insulating layer 3 has been separated to a smaller extent than in FIG. 2.

Thus the upper part of the edge of the strip 2 is coated with oxide. Consequently, the layer of polycrystalline silicon 5, which has been etched in turn in the form of a strip and given a N-type doping, can set up a junction zone only in the zone 7 of the edge intended for this purpose. Similarly, in the concealed part of the drawing, a PN junction is made on the other available edge 10 of the strip 2.

Figure 5:
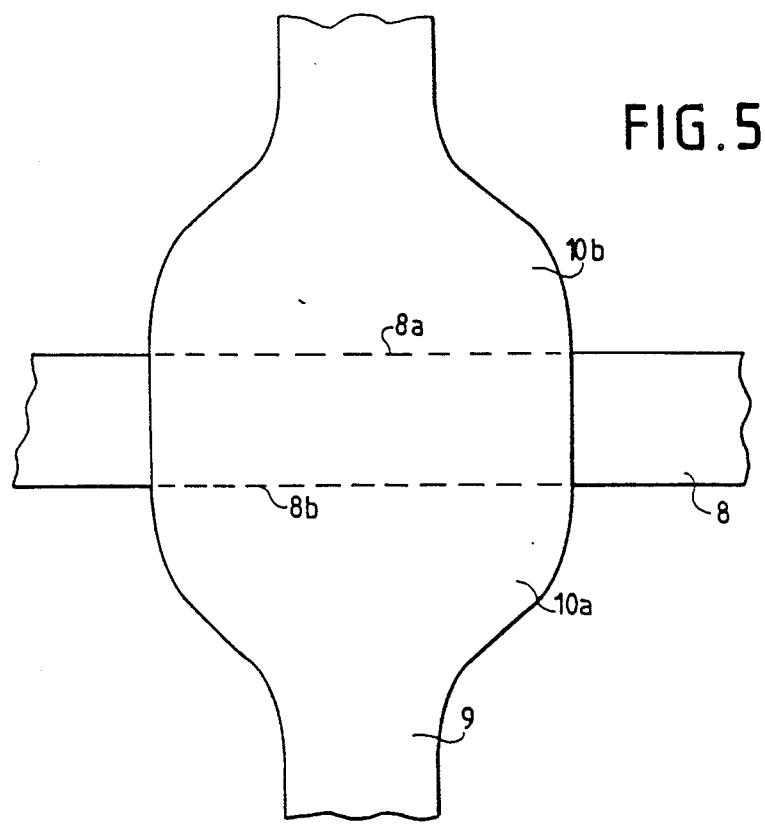
FIG. 5 is a schematic view of another embodiment.

It is seen that the connections according to the invention can have many advantageous shapes depending on the applications for which they are intended. More particularly, for reasons of current density, the invention enables the making of junctions or connections between large surfaces occupying relatively small amounts of space. FIG. 5 shows an embodiment of this feature of the invention. A first strip 8, similar to the strip 2 of FIG. 4, has been etched on a suitable substrate. A strip 9 has been deposited and etched to set up junctions with the edges 8a and 8b of the strip 8. In order to extend the surface of the junction, the strip 9 is widened in the transition region 10 where it covers the lower strip 8 so as to form the zones 10a and 10b.

Figure 6:
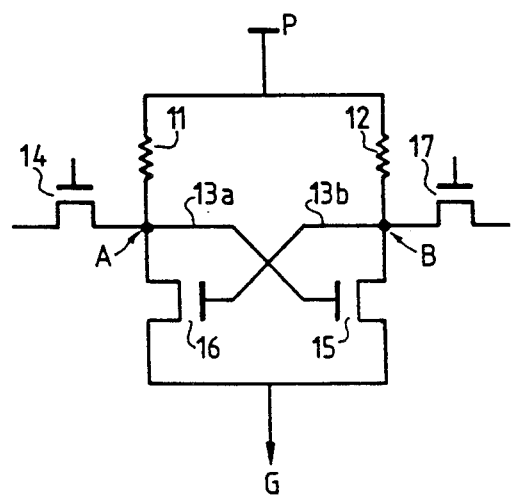
FIG. 6 is an electrical diagram of a first circuit made according to the invention.

FIG. 6 shows a static memory cell SRAM with four transistors, with so-called pull-up resistors. These cells are created with two strips of polycrystalline silicon according to the method described above. The first polycrystalline silicon level follows the connections 13a and then 13b. From left to right, the first strip connects the source and then the drain of the transistor 14 and joins the gate zone of the transistor 15. It thus undergoes a first interruption between the source and the drain of the transistor 14 and, then, upon arrival at the gate of the transistor 15. It then continues on the gate of the transistor 16 and will constitute the drain and source of the transistor 17.

The second strip or second polycrystalline silicon level has resistance zones 11 and 12 separated by a connection at the biased track P, and goes along a circular path passing through the sources and drains of the transistors 15 and 16. Between the drains of the transistors 15 and 16, it has a connection to the grounded track G.

The invention can be used to provide a simple solution to the problem of the connection of the two polysilicon strips 1 and 2 to the common points A and B of the diagram. To this end, double-edge contacts are made as described in the above figures. In standard technology, these two contacts A and B have a considerable area which is considerably reduced in the invention. Furthermore, the invention makes it possible here to eliminate the repetitive masking of the A/B polycrystalline inter-silicon connections of all the cells of the SRAM memory block.

This possibility of interconnection between the two levels of polycrystalline silicon can be extended to prediffused arrays as well as programmed arrays of the PLA type.

Figure 7:
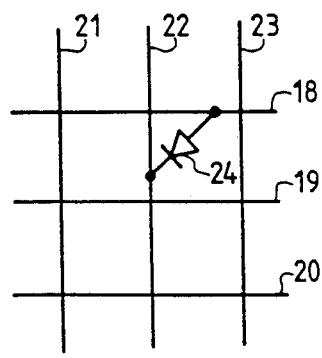
FIG. 7 is an electrical diagram of a second circuit made according to the invention.

FIG. 7 shows a part of a programmable matrix memory of the ROM type. A logic "1" or logic "0" can be programmed therein by the presence or absence of a junction. To this effect, the lines 18 to 20 are made of a P-type polycrystalline silicon etched in parallel strips and the columns 21 to 23 are made of an N-type polycrystalline of the N type, etched in parallel strips which are orthogonal to the former strips. Only one PN junction is programmed in the zone shown in FIG. 7.

Figure 8:
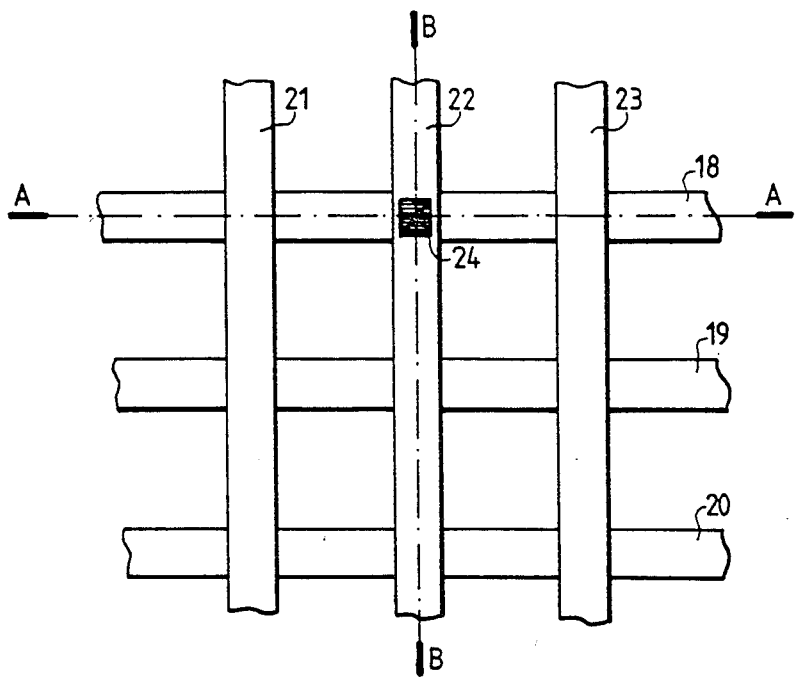
FIG. 8 is a mask diagram of the circuit of FIG. 7, FIGS. 9 and 10 are sectional views along A—A and B—B, respectively, of FIG. 8.
Figure 9:
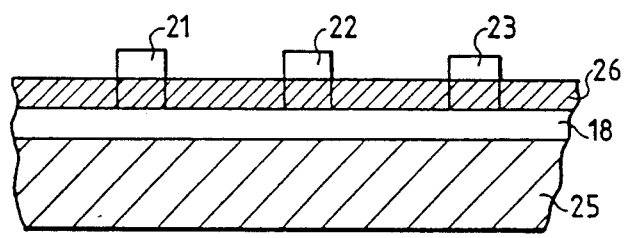
Figure 10:
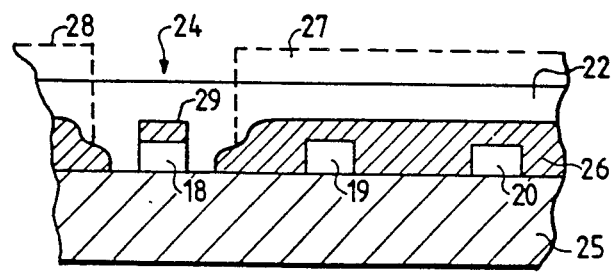

FIGS. 8 to 10 show the embodiment of this memory zone according to the method of the present invention. FIG. 8, which is a top view, gives a schematic representation of the location of the junction 24 at the intersection of the strips 18 and 22. The broken, horizontal line shows the axis of the sectional view of FIG. 9 and the broken vertical line shows the axis of the sectional view of FIG. 10. In these drawings, the same elements as those of FIG. 7 are given the same references.

The sectional view of FIG. 9 shows the insulating substrate 25, the line 18 made of N-type polycrystalline silicon and an insulating layer 26 made of silicon oxide between the polycrystalline silicon layers. This layer may be made of orthogonal strips superimposed on strips of polycrystalline silicon, but it may also be etched exclusively at places where only one junction is planned. In the example shown in FIG. 8, the oxide layer would mask the lines 18 to 20 and would have an opening surrounding the junction zone 24. Above this layer or strip 26, strips of P-type polycrystalline silicon 21 to 23 are observed.

In FIG. 10, only the strip 18 receives a two-edge contact protected by a silicon oxide pin 29. In one embodiment of the invention, a layer of resin 27, 28 shown in dashed lines has been deposited on the oxide. This layer of resin is used to protect the oxide zones which have to be preserved for etching. In this case, the open window in the layer of resin does not have to be precise unlike in standard methods.

The invention can be used more particularly to reduce the total area occupied by a conventional cell by 10% to 20%. It also makes it possible to eliminate a masking operation and, especially, for circuits made to order, to postpone the programming stage in ROM, PLA, FPLP and other to the very last step of the manufacturing process, thus making it possible to entirely standardize the initial stages of the manufacture of a given product.

What is claimed is:

1. A method for establishing a contact between two conductive or semiconductive layers deposited on a substrate, comprising the following steps:

depositing a first conductive or semiconductive layer on the substrate, and selectively etching said layer so as to define in said first layer regions having lateral edges;

depositing an insulating layer on the substrate, under pressure and temperature conditions such that the insulating layer has a thickness which is smaller around the lateral edges of said regions than over the remainder of the substrate including the remainder of said first layer regions;

chemically etching the insulating layer to an amount which is at least equal to the thickness of said insulating layer where it is smaller but which is substantially less than the thickness of said insulating layer elsewhere;

depositing a second conductive or semiconductive layer over the etched insulating layer under pressure and temperature conditions leading to high covering capacity, so as to form a contact between said first and second conductive or semiconductive layers at the edges of said first layer.

2. A method according to claim 1, wherein the insulating layer comprises silicon oxide with 8% to 9% of phosphorus.

3. A method according to claim 1, wherein the insulating layer is deposited by vapor phase deposition at low pressure and low temperature.

4. A method according to claim 2, wherein the insulating layer is deposited by vapor phase deposition at low pressure and low temperature.

5. A method according to claim 3, wherein the insulating layer is deposited at a temperature ranging from about 400° C. to about 450° C.

6. A method according to claim 4, wherein the insulating layer is deposited at a temperature ranging from about 400° C. to about 450° C.

7. A method according to claim 1, wherein certain zones of the insulating layer are covered with a protective resin prior to the chemical etching step, so as to be protected during that step.

8. A method according to claim 2, wherein certain zones of the insulating layer are covered with a protective resin prior to the chemical etching step, so as to be protected during that step.

9. A method according to claim 3, wherein certain zones of the insulating layer are covered with a protective resin prior to the chemical etching step, so as to be protected during that step.

10. A method according to claim 4, wherein certain zones of the insulating layer are covered with a protective resin prior to the chemical etching step, so as to be protected during that step.

11. A method according to claim 5, wherein certain zones of the insulating layer are covered with a protective resin prior to the chemical etching step, so as to be protected during that step.

12. A method according to claim 6, wherein certain zones of the insulating layer are covered with a protective resin prior to the chemical etching step, so as to be protected during that step.

13. A method of contact between two conductive or semiconductive layers deposited on a substrate, comprising the following steps:
   depositing and selectively etching a first conductive or semiconductive layer to provide etched zones,
   depositing an insulating layer over said etched first layer and substrate under pressure and temperature conditions such that the insulating layer is thin at the edges of the etched zones of the first layer and thicker on the surface of the substrate and on the surfaces of the etched zones of the first layer,
   chemically etching the insulating layer in an amount least equal to the thickness of the thin layer but substantially less than the thickness of the thick layer,
   depositing and etching a second conductive or semiconductive layer under pressure and temperature conditions such that said second layer being upon the etched insulating layer and substrate and in contact with the edges of said first conductive or semiconductive layer.

* * * * *